United States Patent [19]

Lindig et al.

[11] Patent Number: 4,827,210

[45] Date of Patent: May 2, 1989

[54] CROSS-COIL MOVING-MAGNET MEASURING INSTRUMENT

[75] Inventors: Christian Lindig, Kelkheim; Roland Duffait, Eschborn, both of Fed. Rep. of Germany

[73] Assignee: VDO Adolf Schindling AG, Frankfurt am Main, Fed. Rep. of Germany

[21] Appl. No.: 829,681

[22] Filed: Feb. 14, 1986

[30] Foreign Application Priority Data

Feb. 20, 1985 [DE] Fed. Rep. of Germany ....... 3505861

[51] Int. Cl.⁴ .......................................... G01R 11/30
[52] U.S. Cl. ..................................... 324/146; 324/143
[58] Field of Search ................ 324/146, 143; 335/299, 335/282, 222; 336/188, 189, 207

[56] References Cited

U.S. PATENT DOCUMENTS

| | | | |
|---|---|---|---|
| 3,168,689 | 2/1965 | Gelenias | 340/319 |
| 3,302,191 | 1/1967 | Ziegler | 340/870.4 |
| 3,327,208 | 6/1967 | Allen | 324/131 |
| 3,460,038 | 8/1969 | Ziegler | 324/132 |
| 4,492,920 | 1/1985 | Reenstra | 324/146 |
| 4,633,174 | 10/1986 | Lindig et al. | 324/146 |

FOREIGN PATENT DOCUMENTS 3232302 3/1984 Fed. Rep. of Germany ...... 324/146

Primary Examiner—Reinhard J. Eisenzopf
Assistant Examiner—Anthony L. Miele
Attorney, Agent, or Firm—Martin A. Farber

[57] ABSTRACT

In a cross-coil moving-magnet measuring instrument having an approximately cylindrical core developed as winding form, a first coil and a second coil are wound crosswise one over the other. The second coil is necessarily arranged over the first coil in the region of the ends of the winding form and thus has a greater height of turn than the latter. Within the core there is furthermore mounted a moving magnet whose pointer shaft is brought out from an extension of the core. In order to reduce the errors in linearity of this measuring instrument and to permit a display over several quadrants, spacing elements are arranged on the core, they serving to guide turns of the coil, spaced from the extension of an core, around the latter in planes which are at right angles to each other. In combination herewith, the core is shaped in the winding region of the first coil with a larger diameter, which is of such a size with respect to the diameter of the winding region of the second coil that the average lengths of turn of the two coils are in correspondence.

2 Claims, 2 Drawing Sheets

CROSS-COIL MOVING-MAGNET MEASURING INSTRUMENT

FIELD AND BACKGROUND OF THE INVENTION

The present invention relates to a cross-coil moving-magent measuring instrument having an approximately cylindrical core developed as a winding form upon which coils are wound crosswise, one upon the other.

Such known cross-coil moving-magnet measuring instruments are used for various measuring and display purposes, for instance for measuring the level of a liquid or a temperature, or else as a voltmeter or an ammeter.

The known cross-coil moving-magnet measuring instruments have a core which is used as winding form and within which the moving magnet is rotatably supported. From one end of the core an extension protrudes in which the shaft of the moving magnet is positioned, the magnet receiving the pointer shaft which is extended out of said extension.

It has been found that with known cross-coil moving-magnet measuring instruments of the above type only angles of deflection which are slightly greater than 90° can be obtained.

If substantially only the first quadrant is to be used in these measuring instruments, it is possible to effect a calibration to the desired end value of the full deflection by adjustment of at least one voltage signal which acts on one of the two coils. However, it is not readily possible to use such cross-coil moving-magent measuring instruments for display over several quadrants since a displacement of the end value in the first quadrant necessarily results in an oppositely directed displacement in the third quadrant.

SUMMARY OF THE INVENTION

The object of the present invention is therefore to further develop the cross-coil moving-magnet measuring instrument of the above type in such a way that it can be used with sufficient precision for display over several quadrants, and in particular up to the third quadrant. Difficulties resulting from calibration by means of adjustment of a voltage signal in a coil are to be avoided.

This object is achieved by developing the core with spacing means for guiding turns of the coils in perpendicular directions.

By virtue of the invention, a lack of linearity of the pointer deflection over several quandrants is substantially reduced, so that control of the voltage of both coils is possible by two voltage signals whose maximum values are the same. In this way, the error in the third quadrant is no longer increased by calibration in the first quadrant, or vice versa.

The spacing means are preferably developed as elongated ribs which are introduced into the cylindrical wall region of the core and are at least as wide as the extension of the core where the pointer shaft is brought out.

With the elongated ribs which preferably extend into the ends of the core and are rounded off at the ends as well as on their top sides, a particularly reliable guidance of the winding wire, which does not interfere with the winding process is assured.

BRIEF DESCRIPTION OF THE DRAWING

One embodiment of the winding form of the invention is described below with reference to the two figures of the drawing, in which.

DETAILED DESCRIPTION OF THE PREFERRED EMBODIMENT

Figure 1:
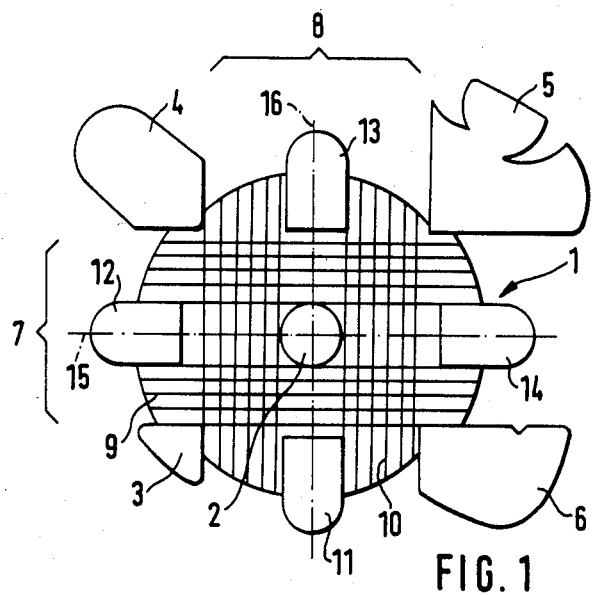
FIG. 1 is a view of the core from the end from which the extension—not shown—extends.
Figure 2:
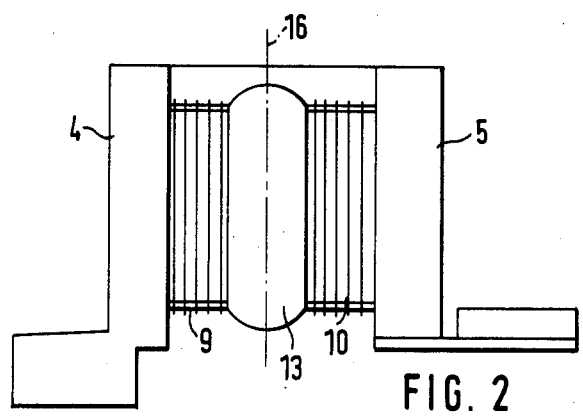
FIG. 2 is a side view of the core.
Figure 3:
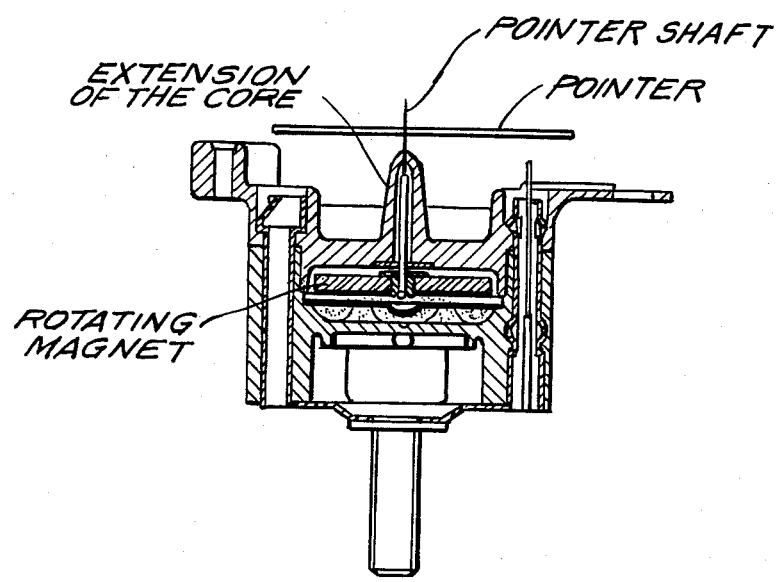
FIG. 3 shows a pointer shaft extending from an extension of the core of FIG. 1.

From FIGS. 1 and 2 there can be noted the substantially cylindrical shape of the core used as winding form, the core being designated generally as 1. An extension (not shown) for a pointer shaft—also not shown—extends from the place 2 out of one end of the core. By means of guide elements 3 to 7 on the periphery of the cylindrical shape of the core, the core is divided into two winding regions 7 and 8. The winding region is intended for the winding of the core with a first coil 9 upon which a second coil 10 is cross-wound 90° in the second winding region.

As indicated in FIG. 1, the diameter of the core in the winding region 7 is greater than in the winding region 8, and this in such a manner that the greater pitch of the turns of the second coil 10 as compared with the first coil 9 is compensated for, i.e. the magnetic flux density of the two coils 9 and 10 in the action on the moving magnet is the same. For identical signal voltages in the two coils, the same number of turns and the same diameters of wire, this results in the following geometry of the winding form:

The geometry of the winding form must be such that the magnetic flux density of the two coils 9 and 10 is the same.

$$B_{coil\ 9} = B_{coil\ 10} = (O_9/A_9) = (O_{10}/A_{10})$$

in which:

$B_{coil\ 9}$ is the magnetic flux density of the coil 9
$B_{coil\ 10}$ is the magnetic flux density of the coil 10
$O_9$ is the magnetic flux of coil 9
$O_{10}$ is the magnetic flux of coil 10
$A_9$ is the cross-sectional area of the field, coil 9
$A_{10}$ is the cross-sectional area of the field, coil 10.

Since the outer coil 10 surrounds a larger cross-sectional area than the inner coil ($A_{10} > A_9$), $O_{10}$ must be larger than $O_9$ in the relation to the cross-sectional area.

These conditions are suitably satisfied in the manner that $A_9$ is increased by enlarging the winding form in the winding region 7. In this way, the resistance $R_9$ of the coil 9 is increased, the current $I_9$ in the coil 9 simultaneously decreasing.

Thus the ratio $O_9/A_9$ is equal to the ratio $O_{10}/A_{10}$.

In this way there is obtained a linearity of the display which is many times greater than that of known cross-coil moving-magnet measuring instruments; in other words the deviation of the measured value displayed from the desired value is substantially less.

In connection with the above measures, there is also to be noted the construction measure that by four elongated ribs 11 to 14 it is seen to it that the windings of the coils are not pushed away out of the region of the extension at the place 2 but are guided in flat planes at right angles to each other. The flat right-angle planes theoretically intersect the core in longitudinal planes outside of the imaginary central longitudinal axis of the core. The elongated ribs divide each of the two winding regions 7 and 8 into two partial windings region of the same size. Therefore, symmetrical conditions are present for the winding of the core around two planes, namely the imaginary central planes which extend, on the one hand through, the ribs 8 and 11 and, on the other hand, through the ribs 12 and 14. These central planes are designated 15 and 16.

The rounded shape of the ribs 11 and 14 at their ends and on their outer surfaces can be noted in detail from the drawing. This shape can facilitate the winding process and furthermore help to avoid damage to the wire.

We claim:

1. A crossed-coil moving-magnet measuring instrument having an approximately cylindrical core developed as winding form, the instrument further comprising a first coil and a second coil wound about the core and disposed respectively in a first plane and a second plane which are perpendicular to each other and parallel to an axis of the core, on which core the first coil and the second coil are wound crossed one over the other, the second coil passing in the regions of ends of the winding form over the first coil and thus having a greater height of turn than the latter, there being mounted within the core a moving magnet having a pointer shaft brought out from an extension of the core, the measurement instrument further comprising spacing means disposed on the core for guiding turns of the coils alongside the extension of the core; the spacing means being arranged around the core in the first and the second planes; and wherein the core is asymmetric as viewed in a third plane being larger than a core diameter in the second plane by an amount equalizing the effect of magnetic flux of the first and second coils on the moving magnet.

2. The cross-coil moving-magnet measuring instrument according to claim 1, wherein the spacing means are formed as elongated ribs extending along the first and the second planes parallel to said core axis, each of which ribs is at least as wide as said extension, the ribs being disposed on cylindrical wall regions of the core.

* * * * *